(12) United States Patent
Matsui (10) Patent No.: US 6,846,993 B2
(45) Date of Patent: Jan. 25, 2005

(54) MULTILAYER PRINTED WIRING BOARD AND ITS MANUFACTURING METHOD

(75) Inventor: Isao Matsui, Tokyo (JP)

(73) Assignee: NEC Corporation, Tokyo (JP)

(*) Notice: Subject to any disclaimer, the term of this patent is extended or adjusted under 35 U.S.C. 154(b) by 55 days.

(21) Appl. No.: 10/267,788

(22) Filed: Oct. 10, 2002

(65) Prior Publication Data

US 2003/0070838 A1 Apr. 17, 2003

(30) Foreign Application Priority Data

Oct. 12, 2001 (JP) ......................................... 2001-316001

(51) Int. Cl.⁷ ............................. H05K 1/11; H01R 12/04
(52) U.S. Cl. ......................... 174/262; 174/255; 174/265; 174/266; 361/795
(58) Field of Search ................................ 174/262, 263, 174/264, 265, 266, 255, 256, 260, 261; 361/792, 793, 794, 795; 29/852, 846

(56) References Cited

U.S. PATENT DOCUMENTS

| | | | | | |
|---|---|---|---|---|---|
| 5,451,720 | A | * | 9/1995 | Estes et al. ................. | 174/250 |
| 6,184,478 | B1 | * | 2/2001 | Imano et al. ................ | 174/261 |
| 6,388,206 | B2 | * | 5/2002 | Dove et al. .................. | 174/262 |
| 6,486,414 | B2 | * | 11/2002 | Kobayashi et al. ......... | 174/261 |
| 6,521,842 | B2 | * | 2/2003 | Brinthaupt et al. ......... | 174/252 |
| 6,727,435 | B1 | * | 4/2004 | Egan et al. .................. | 174/250 |

FOREIGN PATENT DOCUMENTS

| | | |
|---|---|---|
| JP | 57-149789 A | 9/1982 |
| JP | 59-161897 A | 9/1984 |
| JP | 61-220398 A | 9/1986 |

* cited by examiner

*Primary Examiner*—Kamand Cuneo
*Assistant Examiner*—I B Patel
(74) *Attorney, Agent, or Firm*—Sughrue Mion, PLLC (57) ABSTRACT

A conductive film has a plurality of clearances (openings) and a plurality of auxiliary clearances. The plurality of clearances and the plurality of auxiliary clearances are formed to have such numerical apertures and locations that generate no bias in the distribution of conductive film in consideration of the entire conductive film. The conductive film can disperse stress caused by thermal expansion etc., to ease by having the plurality of clearances and the plurality of auxiliary clearances. Accordingly, the conductive film is less prone to being peeled off the insulating film. Further, since the distribution of conductive film is substantially uniform as a whole, the transfer characteristics that are fixed by the distribution become substantially uniform as a whole.

18 Claims, 5 Drawing Sheets

MULTILAYER PRINTED WIRING BOARD AND ITS MANUFACTURING METHOD

BACKGROUND OF THE INVENTION

1. Field of the Invention

The present invention relates to a multilayer printed wiring board (PWB) and its manufacturing method and more particularly to a built-up multilayer PWB having a conductive film, which resists peeling, and its manufacturing method.

2. Description of the Related Art

The multilayer printed wiring board is composed of a plurality of layers. Each layer has an insulating film, a via-hole, which is formed in the insulating film and which is plated in its interior, and a conductive film layered on the insulating film. In connection with the conductive layer, there is a so-called voltage plane, which is connected to a signal line and an external power source which transmits current and voltage that are output from the power source to the signal line. The voltage plane is connected to the signal line through plating of the interior of via-hole.

Techniques that relate to the multilayer printed wiring board having the conductive film that is called voltage plane are described in, for example, Unexamined Japanese Patent Publication Nos. S57-149789, S59-161897, and S61-220398.

In these techniques, the conductive film has a plurality of clearances (openings) to prevent occurrence of peeling off the insulating film caused by thermal expansion, etc. The conductive film can disperse stress caused by thermal expansion, etc. to ease by forming the plurality of clearances. The plurality of clearances causes variations in transfer characteristics of the conductive film if the distribution is biased. For this reason, the plurality of clearances is formed in the conductive film to prevent a bias from being generated in the distribution.

In the conventional techniques, the clearances must be designed to prevent contact with the via-hole. However, if the clearances are designed to prevent contact with the via-hole, the distribution of clearances is biased, with the result that variations are generated in the transfer characteristics of conductive film, Further, since the clearances cannot be formed in the vicinity of the via-hole in order to avoid the via-hole, there is a case in which the conductive film close to the via-hole resultantly is peeled off the insulating film by thermal expansion, etc.

SUMMARY OF THE INVENTION

The present invention has been made with consideration given to the aforementioned circumstances and an object of the present invention is to provide a multilayer printed wiring board having a conductive film, which resists peeling.

Moreover, another object of the present invention is to provide a multilayer printed wiring board having a conductive film whose transfer characteristics are substantially uniform as a whole.

In order to solve the aforementioned problems, according to a first aspect of the present invention, there is provided a multilayer printed wiring board comprising a plurality of layers each having an insulating film and a conductive film stacked upon said insulating film, wherein at least one layer among said plurality of layers has at least one via-hole being formed in its insulating film and having a metallic coating connected to at least one of conductive films, which said plurality of layers has, in its interior; and said conductive film, which said at least one layer has, has a plurality of first openings formed with fixed intervals and a plurality of second openings having sizes and shapes smaller than those of the first openings and being formed with fixed intervals in the vicinity of the at least one via-hole to prevent contact with the first openings.

The plurality of second openings may have substantially equal sizes and shapes, respectively.

The plurality of second openings may be formed in the vicinity of the at least one via-hole to surround the at least one via-hole.

The conductive film may further have a plurality of third openings being formed between the plurality of first openings and the plurality of second openings and having sizes and shapes being smaller than those of the first openings and larger than those of the second openings.

In order to solve the aforementioned problems, according to a second aspect of the present invention, there is provided a manufacturing method of a multilayer printed wiring board comprising the step of layering a plurality of layers each having an insulating film and a conductive film stacked upon the insulating film; the step of forming at least one via-hole in the insulating film, which at least one layer has, to precipitate a metallic coating connected to at least one film in the interior; the first opening forming step or forming a plurality of openings, each having equal size and shape, in a conductive film, which the at least one layer has, with fixed intervals; and the second opening forming step of forming a plurality of openings, each having a size and a shape smaller than those of the first openings and the via-hole, with fixed intervals in the vicinity of the at least one via-hole to prevent contact with the plurality of first openings.

The second opening forming step may comprise the step of forming the plurality of second openings, each having equal size and shape, in the conductive film.

The second opening forming stop may comprise the step of forming the plurality of second openings in the vicinity of the at least one via-hole to surround the at least one via-hole.

The second opening forming step may further comprise the step of forming a plurality of third openings each having size and shape smaller than those of the first openings and larger than those of the second openings.

The second opening forming step may comprise the step of forming the plurality of third openings between the plurality of first openings and the plurality of second openings.

The first and second opening forming steps may comprise the step of forming the plurality of first openings and the plurality of second openings such that the distribution of the conductive film becomes substantially uniform in consideration of the entire conductive film.

In order to solve the aforementioned problems, according to the third aspect of the present invention, there is provided a multilayer printed wiring board comprising a layer which has an insulating film and a conductive film stacked upon said insulating film; a via-hole which) is formed on said layer; a plurality of first openings which is formed around said via-hole on said conductive film; and a plurality of second openings each of which has a size smaller than that of each of said first openings on said conductive film.

Each of the second openings may have a diameter within the range of 30 to 100 micrometer.

The shape of each of the second openings may be circle.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

The following will specifically explain the multilayer printed wiring board and its manufacturing method according to the embodiments of the present invention using an example of a built-up multilayer printed wiring board with reference to the drawings accompanying herewith, (First Embodiment)

Figure 1:
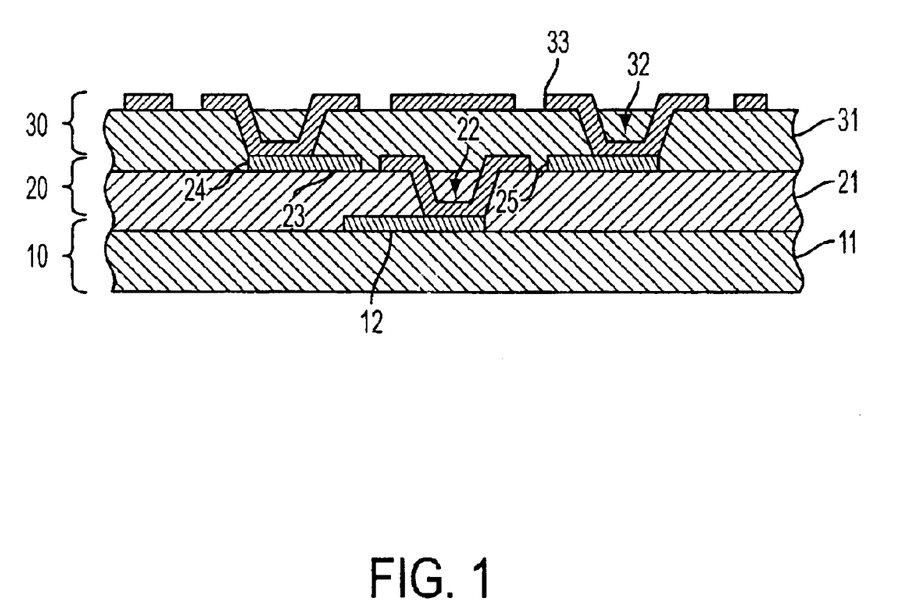
FIG. 1 is a cross-sectional view illustrating a structure of a built-up multilayer printed wiring board according to a first embodiment of the present invention.

The built-up multilayer printed wiring board of this embodiment includes a core substrate 10, a built-up layer 20, and a built-up layer 30 as illustrated in FIG. 1.

The core substrate 10 is formed of a copper-clad laminate having an insulating film 11 and a conductive pattern 12 formed on one surface of the insulating film 11.

The insulating film 11 is formed of insulating resin such as glass epoxy resin. The conductive pattern 12 is formed of a conductive material such as copper foil, etc.

A built-up layer 20 has an insulating film 21, a via-hole 22 formed in the insulating film, and a conductive film 23 formed on the surface of the insulating film 21.

The insulating film 21 is formed of thermosetting resin such as film-like epoxy resin. The via-hole 22 has a depth reaching the conductive pattern 12 and a metallic coating such as copper, which is precipitated by electroless plating or electrolytic plating, in its interior. The conductive film 23 is formed of a conductive material such as copper foil, etc and is connected to the conductive pattern 12 through the metallic coating of via-hole 22. Moreover, the conductive film 23 is connected to an external power source (not shown) to transfer power that is output from the power source to a conductive pattern 33 to be described later. Accordingly, the conductive film 23 forms a voltage plane of the conductive pattern 33.

Figure 2:
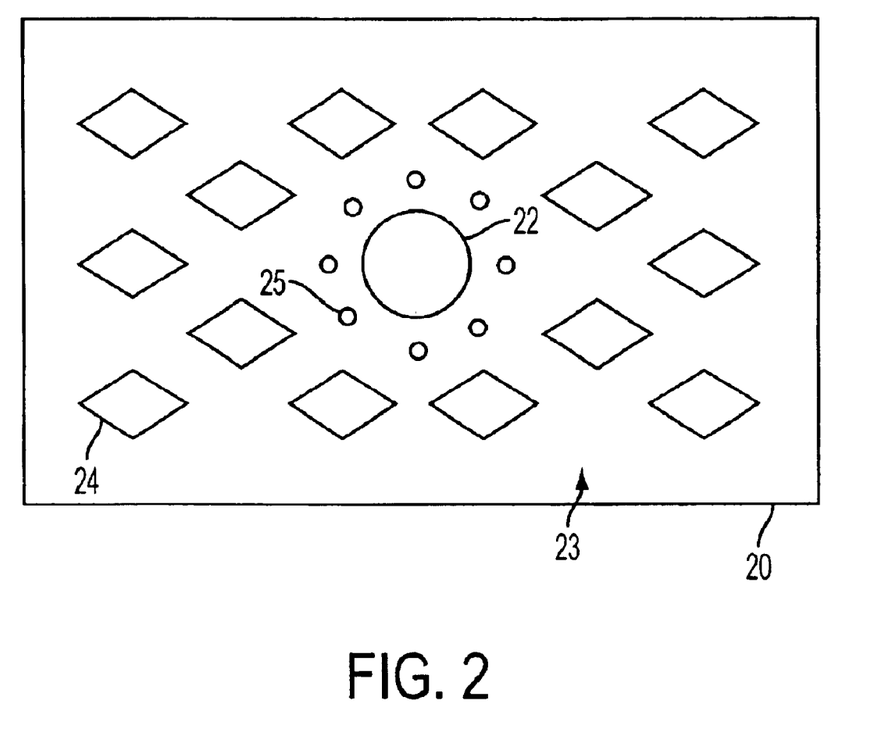
FIG. 2 is a plan view illustrating a built-up layer of the built-up multilayer printed wiring board of FIG. 1.

The conductive film 23 has a plurality of clearances 24 (openings) and a plurality of auxiliary clearance (openings) 25 in order to ease stress caused by thermal expansion etc. In consideration of the entire conductive film 23, these clearances 24 and 25 are formed to have such numerical apertures and locations that generate no bias in the distribution of conductive film 23 in order that transfer characteristics peculiar to the conductive film 23 become substantially uniform as a whole.

More specifically, the respective clearances 24 are formed to have diamond shapes each having one side of 0.05 to 0.25 mm in length and a fixed interval. As mentioned above, the clearances 24 have substantially equal shapes and sizes, respectively and are Isolated uniformly excepting the portion close to the via-hole 22 in order to prevent a partial bias from being generated in the transfer characteristics of, conductive film 23. The plurality of clearances 24 disperses stress caused by thermal expansion, etc.

In the vicinity of the via-hole 22, the plurality of auxiliary clearances 25 is formed. Each auxiliary clearance 25 has a diameter of 30 to 100 μm, and its shape and size are smaller than those of the via-hole 22, and are distributed substantially uniformly in the vicinity of the via-hole 22 to surround the via-hole 22. The clearances 25 have substantially equal shapes and sizes, respectively in order to prevent a partial bias from being generated in the transfer characteristics of conductive film 23. Particularly, the plurality of auxiliary clearances 25 disperses stress caused in the vicinity of tie via-hole 22 since they are substantially uniformly located in the vicinity of the via-hole 22.

Stress generated by thermal expansion, etc., concentrates at a position where stress is generated (tends to concentrate at one point). However, since the plurality of clearances 24 and that of clearances 25 are formed to have such numerical apertures and locations that make the distribution of conductive film 23 substantially uniform as a whole, stress that trends to concentrate at only the stress-generated position is entirely dispersed to make it possible to ease stress.

In addition, since the shapers of the clearances 24 and 25 are simple, their numerical apertures and locations can be easily designed using a layout design tool for multilayer printed wiring board The simple shapes make it easy to generate an automatic generation algorithm (automatic generation program) for clearances 24 and auxiliary clearances 25.

The built-up layer 30 has an insulating film 31, a via-hole 32 formed in the insulating film 31, and a conductive pattern (conductor circuit) 33 formed on the insulating film 31.

The insulating film 31 is formed of thermosetting resin such as film-like epoxy resin, The via-hole 32 has a metallic coating such as copper, which is precipitated by non-electrolytic plating or electrolytic plating, in its interior. The conductive pattern 33 is formed of copper foil, etc and is connected to the conductive film 23 through the metallic coating of via-hole 32.

An explanation will be next given of the manufacturing method of the built-up multilayer printed wiring board according to this embodiment with reference to the drawings accompanying herewith.

The built-up multilayer printed wiring board is manufactured through the process set forth below. Additionally, the process explained below is no more than one example, and any process may be possible if the same structure can be obtained.

First, a copper-clad laminate with copper foil formed on one surface or the insulating resin is prepared in order to form the core substrate 10 having the insulating film 11 and conductive pattern 12. The copper foil of copper-clad laminate is patterned to form the conductive pattern 12.

Next, the built-up layer 20 having the insulating film 21, via-hole 22, conductive film 23, is stacked upon one surface of the core substrate 10. More specifically, first, the surface of conductive pattern 12 is roughened such that the insulating film 21 is easily bonded to the conductive pattern 12. Moreover, a part of the surface of insulating film 11, that is, a part where no conductive pattern 12 is layered, is roughened. Next, the insulating film 21 (film-like thermosetting resin) is stacked upon the insulting film 11 and conductive pattern 12 by thermal compression bonding.

The surface of insulating film 21 is polished and smoothed. Next, the insulating film 21 is irradiated with a laser beam to form the via-hole 22 reaching the conductive pattern 12. In order to easily precipitate the copper foil that forms the conductive film 23, the interior of via-hole 22 and the surface of insulating film 21 are roughened. Then, the interior of via-hole 22 and the surface of insulating film 21 are subjected to electroless plating to precipitate the copper foil. A plating resist (not shown) is formed in a predetermined region where the clearances 24 and auxiliary clearances 25 are formed in order to form the conductive film 23 having the plurality of clearances 24 and the plurality of auxiliary clearances 25 on the surface of the copper toil as shown in FIG. 2.

A part where the copper foil is exposed without being coated with the plating resist is subjected to electrolytic plating to precipitate the copper foil, thereafter removing the plating resist. The copper foil under the plating resist is etched. Then, there is formed the conductive film 23, which is formed of copper foil precipitated by electroless plating, and copper foil precipitated on the above copper foil by electrolytic plating.

On the built-up layer 20 thus formed, the built-up layer 30 having the insulating film 31, via-hole 32, and conductive pattern 33 is stacked. More specifically, first, the surface of the conductive film 23 is roughened. The insulating film 31 (film-like thermosetting resin) is attached onto the conductive film 23 by thermal compression bonding. Sequentially, the surface of insulating film 31 is polished and smoothed. The insulating film 31 is irradiated with a laser beam to form the via-hole 32 reaching the conductive film 23.

The interior of via-hole 32 and the surface of insulating film 31 are roughened. Then, the interior of via-hole 32 and the surface of insulating film 31 are subjected to electroless plating to precipitate the copper foil. A plating resist (not shown) is partially formed in a pail of the surface of the copper foil, that is, a part excepting a predetermined region where the conductive pattern 33 is formed. A part of the surface of insulating film 31 (a part of insulating film 31 where no plating resist is formed) and the interior of via-hole 32 are subjected to electrolytic plating to precipitate the copper foil, thereafter removing the plating resist. The electroless plating under the plating resist is etched. Then, there is formed the conductive pattern 33, which is formed of copper foil precipitate by electroless plating, and copper foil precipitated on the above copper foil by electrolytic plating.

The conductive film 23 of the built-up layer 20 of the built-up printed wiring board thus formed would be connected to an external power source (not shown) to transmit current and voltage that are output from the power source to the conductive patterns 12 and 33.

As explained above, the conductive film 23, which the built-up printed wiring board of this embodiment has includes the plurality of clearances 24. Further, the conductive film 23 also includes the plurality of auxiliary clearances 25 in the vicinity of the via-hole 22. The conductive film 23 can disperse stress caused by thermal expansion, etc. to case by forming the plurality of clearances 24 and the plurality of auxiliary clearances 25. Accordingly, the conductive film 23 of this embodiment is less prone to being peeled off the insulating film 21.

Further, the conductive film 23 has the plurality of clearances 24 and the plurality of auxiliary clearances 25 such that the distribution becomes substantially uniform as a whole with consideration given to the entire layer. For this reason, transfer characteristics fixed by the distribution of conductive film 23 become substantially uniform.

(Second Embodiment)

The first embodiment has explained the ease in which the conductive film 23 has the auxiliary clearances 25 each having equal shape and size. However, in consideration of the entire conductive film 23, if it is possible to make the distribution of conductive film 23 substantially uniform all over, the sizes and shapes of auxiliary clearances 25 do not have to be equal, respectively. The following will explain the embodiment in which the conductive film 23 has the auxiliary clearances 25 each having different shape and size to prevent the conductive film in the vicinity of the via-hole 22 from being peeled with reference to FIG. 3.

Figure 3:
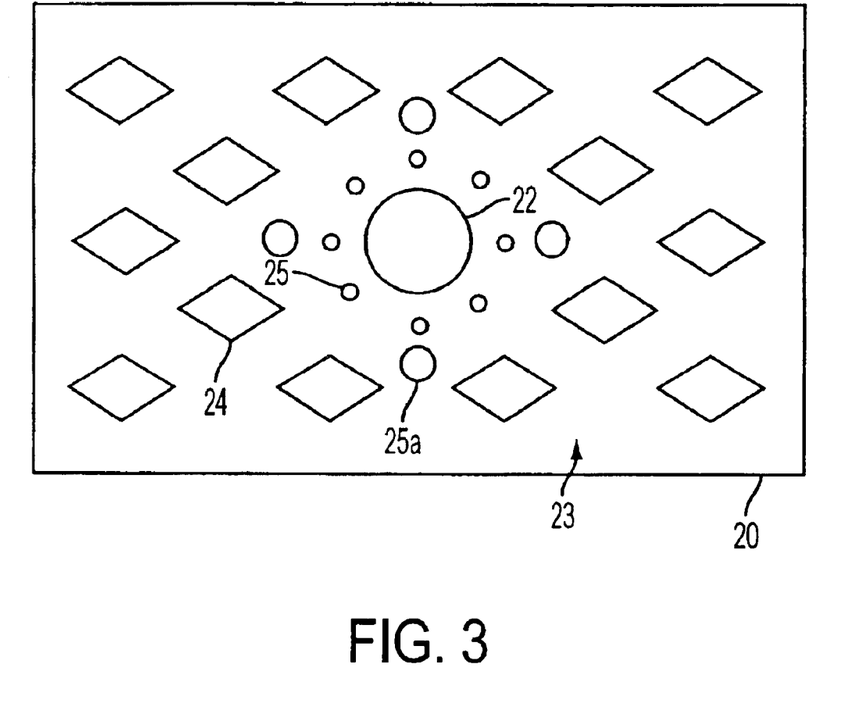
FIG. 3 is a plan view illustrating a built-up layer of a built-up multilayer printed wiring board according to a second embodiment of the present invention.

As illustrated in FIG. 3, the conductive film 23 has a plurality of auxiliary clearances 25a each having size and shape larger than those of the clearance 25 and smaller than those of the clearance 24, in addition to the structure shown in FIG. 2. In addition, if the sizes and shapes of these clearances 25a are made substantially equal, respectively, a deviation is less prone to being generated in the distribution of conductive film 23.

As mentioned above, in order to prevent the conductive film 23 in the vicinity of the via-hole 22 from being peeled off the insulating film 21, the plurality of auxiliary clearances 25a is formed at the position in the vicinity of the via-hole 22. However, in consideration of the entire distribution of conductive film 23, the plurality of clearances 25a is formed to have such numerical apertures and locations that generate no bias in the entire distribution of conductive film 23.

In other words, the sizes and shapes of auxiliary clearance 25 would be varied so as to have the distribution of conductive film 23 entirely uniform.

(Third Embodiment)

The first and second embodiments have explained, as one example, the case in which the built-up layer 20 has only one via-hole 22. However, such a case that the built-up layer 20 has the plurality of via-holes 22 is general. In this case, the plurality of auxiliary clearances 25 may be formed in the same manner of the above embodiments so as to prevent the conductive film 23 from being peeled off the portion in the vicinity of the plurality of via-holes 22 and prevent the bias from being generated in the distribution of the conductive film 23.

The following explains the embodiment in which the built-up layer 20 has two via-holes and tie plurality of auxiliary clearances 25 is formed around these two via-holes. Additionally, in order to facilitate the understanding of this embodiment, the following explains the case, as one example, that two via-holes are adjacent to each other with reference to FIG. 4.

Figure 4:
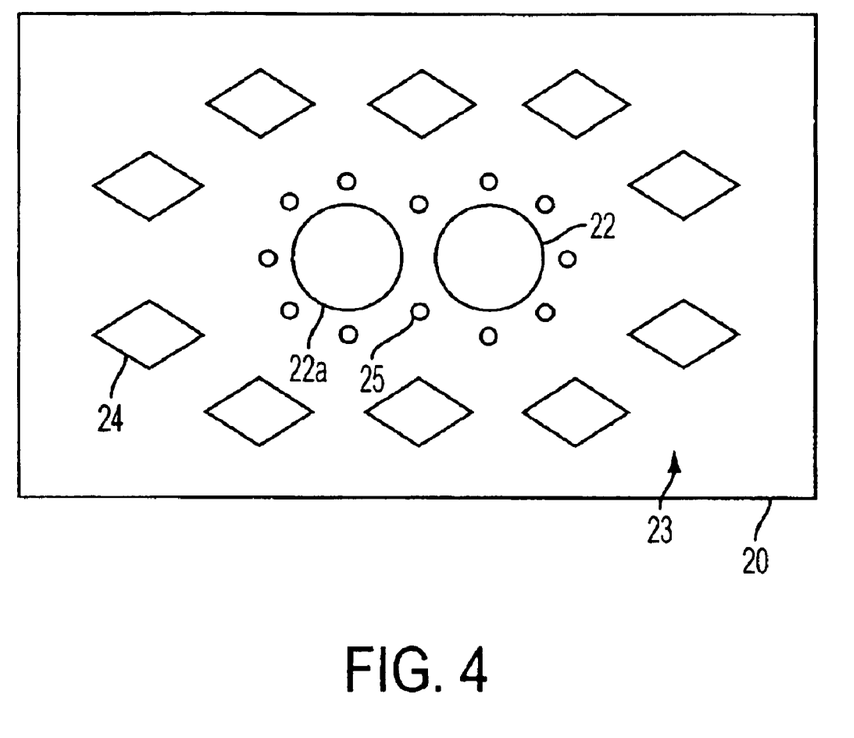
FIG. 4 is a plan view illustrating a built-up layer of a built-up multilayer printed wiring board according to a third embodiment of the present invention.
Figure 5:
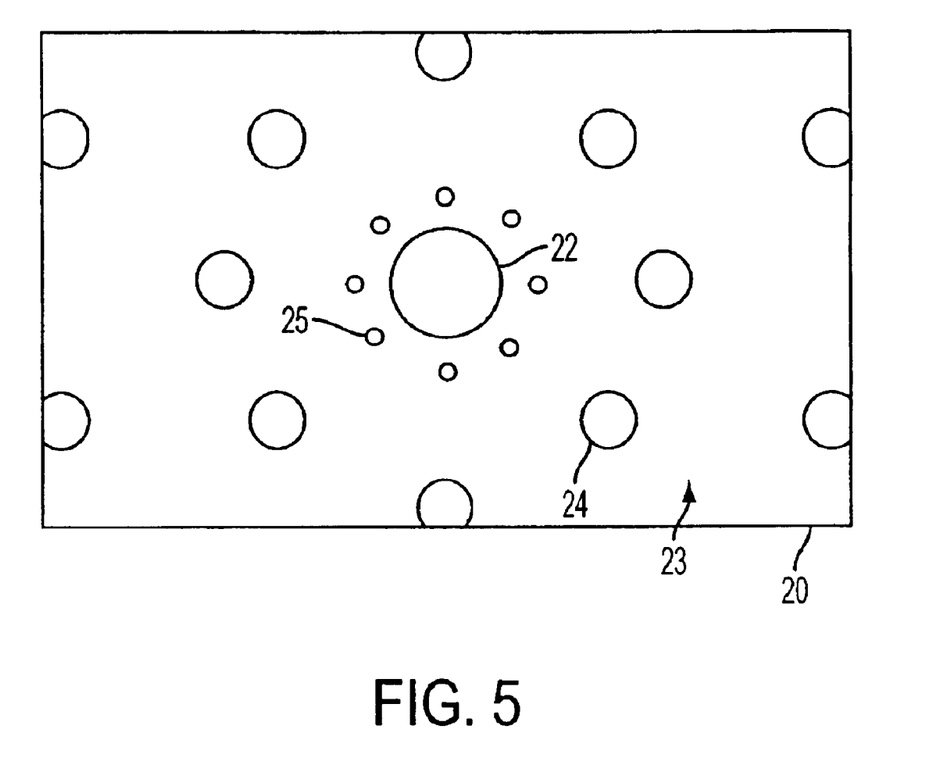
FIG. 5 is a plan view illustrating a built-up layer of a built-up multilayer printed wiring board according to a fourth embodiment of the present invention.

As illustrated in FIG. 4, the built-up layer 20 has a via-hole 22a in addition to then structure shown in FIG. 1. Additionally, in FIG. 4, the same reference numerals as those of FIG. 2 are added to the same elements as those of FIG. 2

As mentioned above, in consideration of the distribution of conductive film 23, the plurality of clearances 24 and the plurality of auxiliary clearances 25 are formed so as for the distribution of conductive film 23 to become substantially uniform as a whole. Accordingly, the transfer characteristics of conductive film 23 which is settled by the distribution of conductive film 23 would be substantially equalized as a whole. Moreover, the conductive film 23 has the plurality of clearances 24 and the plurality of auxiliary clearances 25, making it possible for the conductive film 23 to be less prone to being peeled off the insulating film 21. Particularly, since the plurality of clearances 25 is located in the vicinity of the via-holes 22, 22a, the conductive film 23 around the via-holes 22, 22a is less prone to being peeled off the insulating film 21.

Furthermore, in the case where two or more via-holes 22 are formed, the plurality of clearances 24 may be formed in the vicinity of the via-holes 22 along the shape of via-holes 22 as in this embodiment. The conductive film 23 in the vicinity of the via-holes 22 is thereby less prone to being peeled off the insulating film 21.

(Fourth Embodiment)

In the first to third embodiments, the conductive film 23 has diamond-shape clearances 24. However, in consideration of the distribution of conductive film 23 entirely, as far as no bias is generated in the distribution of the conductive film 23, the clearances 24 do not have to have diamond shapes depending on the case.

For example, since the clearances 24 are diamond-shaped, there is a case in which a crack occurs on the conductive film 23 from the apex of the corner section and the conductive film 23 is peeled off the insulating film 21 due to the crack. In such a case, the shapes of clearances may be circle as shown in FIG. 4. The circular clearances 24 can be more easily designed than the diamond-shape clearances 24. When the circular clearances 24 are equal in the size, the distribution of conductive film 23 can be easily uniformed. However, if the circular clearances 24 are located at the same position where the diamond-shape clearances 24 are formed, a bias is easily generated in the distribution of conductive film 23. For this reason, with sufficient consideration given to the numerical apertures and locations, the circular clearances 24 may be relocated in order to the generation of bias in the distribution of conductive film 23.

Additionally, the present invention is not limited to the aforementioned embodiments. For example, though the above embodiments have explained the case, as one example, in which the conductive film 23 is formed as a voltage plane in the built-up layer 20, the voltage plane may be formed in the core substrate 10 or built-up layer 30. In this case, the plurality of clearances 24 may be formed in the voltage plane and the plurality of clearances 25 may be formed in the vicinity of the via-hole formed in the voltage plane.

Moreover, though the present invention uses the conductive film 23 as the voltage plane, the conductive film 23 may be used as a ground layer. In this case, the conductive film 23 may have the plurality of clearances 24 and the plurality of clearances 25 as in the aforementioned embodiments.

Still moreover, though the above embodiments have explained the built-up printed wiring board as one example, the present invention is not limited to this. The present invention can be carried out even if the other kinds of multilayer printed wiring boards having the voltage plane or ground layer are used. In this case, the plurality of clearances 24 and the plurality of clearances 25 may be formed in the voltage plane or ground layer of the other kinds of multilayer printed wiring boards as in the aforementioned embodiments.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims or the invention and within the claims are to be regarded to be in the scope of the present invention.

This application is based on Japanese Patent Application No. 2001-316001 filed on Oct. 12, 2001 and including specification, claims, drawings and summary. The disclosure of the above Japanese Patent Application is incorporated herein by reference in its entirety.

What is claimed is:

1. A multilayer printed wiring board comprising:
   a first layer comprising a first insulating film and a first conductive film stacked upon said insulating film; and
   a second layer, whereupon the first layer is stacked, comprising a second insulating film and a second conductive film stacked upon said second insulating film, wherein:
   the first layer comprises a first via-hole formed in said insulating film;
   said first via-hole comprises a metallic coating on an inner face thereof connected to the second conductive film at a bottom of the first via-hole;
   said second conductive film, comprises first openings and second openings;
   said second openings are smaller than said first openings and are arranged between said first via-hole and said first openings; and
   the first insulating film contacts the second insulating film through the first and second openings.

2. The multilayer printed wiring board according to claim 1, wherein said second openings have substantially equal sizes an shapes, respectively.

3. The multilayer printed wiring board according to claim 1, wherein said second openings are formed in the vicinity of said first via-hole to surround said first via-hole.

4. The multilayer printed wiring board according to claim 1, wherein said first openings are formed with fixed intervals and said second openings are formed with fixed intervals.

5. The multilayer printed wiring board according to claim 1, wherein a width of each of said second openings is within the range of 30 to 100 micrometers.

6. The multilayer printed wiring board according to claim 1, wherein each of said second openings is circular.

7. The multilayer printed wiring board according to claim 1, further comprising third openings in said first conductive film formed between said first openings and said second openings, wherein said third openings are smaller than said first openings and larger than said second openings.

8. The multilayer printed wiring board according to claim 7, wherein said third openings have substantially equal sizes and shapes, respectively.

9. The multilayer printed wiring board according to claim 1, wherein the first and second openings are concave and comprise lateral walls formed by the second conductive film and a bottom formed by an upper surface of the second insulating film.

10. A multilayer printed wiring board comprising:
    a layer comprising an insulating film and a conductive film stacked upon said insulating film;
    a via-hole formed in said insulating film;
    first openings formed around said via-hole in said conductive film; and second openings, each of which is smaller than each of said first openings, formed in said conductive film, wherein the insulating film contacts a second insulating film of an adjacent layer through the first and second openings.

11. The multilayer printed wiring board according to claim 10, wherein a width of each of said second openings is within the range 30 to 100 micrometers.

12. A The multilayer printed wiring board according to claim 10, wherein each of said second openings is circular.

13. The multilayer printed wiring board according to claim 10, herein said second openings have substantially equal sizes and shapes, respectively.

14. The multilayer printed wiring board according to claim 10, wherein said second openings are formed in the vicinity of said via-hole to surround said via-hole.

15. The multilayer printed wiring board according to claim 10, herein said first openings are formed with fixed intervals and said second openings are formed with fixed intervals.

16. The multilayer printed wiring board according to claim 10, further comprising third openings in said conductive film formed between said first to openings and said second openings, wherein said third openings are smaller than said first to openings and larger than said second openings.

17. The multilayer printed wiring board according to claim 16, wherein said third openings have substantially equal sizes and shapes, respectively.

18. The multilayer printed wiring board according to claim 10, wherein the first and second openings are concave and comprise lateral walls formed by the conductive film and a bottom formed by an upper surface of the insulating film.

* * * * *